US005482871A

United States Patent [19]
Pollack

[11] Patent Number: 5,482,871
[45] Date of Patent: Jan. 9, 1996

[54] METHOD FOR FORMING A MESA-ISOLATED SOI TRANSISTOR HAVING A SPLIT-PROCESS POLYSILICON GATE

[75] Inventor: Gordon P. Pollack, Richardson, Tex.

[73] Assignee: Texas Instruments Incorporated, Dallas, Tex.

[21] Appl. No.: 228,043

[22] Filed: Apr. 15, 1994

[51] Int. Cl.⁶ ............................................. H01L 21/265
[52] U.S. Cl. .................. 437/21; 437/29; 437/44; 437/41; 257/66; 257/347
[58] Field of Search ............... 257/347, 66; 437/21, 437/28, 29, 40, 41, 61, 44

[56] References Cited

U.S. PATENT DOCUMENTS

| | | | |
|---|---|---|---|
| 4,597,160 | 7/1986 | Ipri | 437/61 |
| 4,763,183 | 8/1988 | Ng et al. | 257/347 |
| 5,064,775 | 11/1991 | Chang | 437/41 |
| 5,100,810 | 3/1992 | Yoshimi et al. | 437/21 |
| 5,111,260 | 5/1992 | Malhi et al. | 257/347 |
| 5,185,280 | 2/1993 | Houston et al. | 437/44 |
| 5,188,973 | 2/1993 | Omura et al. | 257/347 |
| 5,210,438 | 5/1993 | Nakamura | 257/347 |
| 5,225,356 | 7/1993 | Omura et al. | 257/347 |
| 5,275,872 | 1/1994 | Chang | 257/347 |
| 5,292,670 | 3/1994 | Sundaresan | 257/347 |
| 5,292,675 | 3/1994 | Codama | 437/21 |
| 5,294,811 | 3/1994 | Aoyama | 257/347 |
| 5,334,281 | 8/1994 | Doerre et al. | 437/61 |

FOREIGN PATENT DOCUMENTS 2277244 11/1990 Japan ................................ 437/21

Primary Examiner—Olik Chaudhuri
Assistant Examiner—Long Pham
Attorney, Agent, or Firm—Carlton H. Hoel; W. James Brady; Richard L. Donaldson

[57] ABSTRACT

A method for forming a mesa-isolated SOI transistor using a split-process polysilicon gate including the steps of depositing a layer of buried oxide (14) on a silicon substrate (12), depositing an SOI layer (16) on buried oxide layer (14), and forming a gate oxide layer (18) on the SOI layer (16). Further steps are to form a gate polysilicon mesa (20) on the gate oxide layer, and an SOI mesa (28) on gate polysilicon mesa (20) and forming an oxide sidewall (26) on the gate polysilicon mesa (20) and SOI mesa (28). A gate electrode (38) is the formed along with an oxide sidewall (36). Implanting gate electrode (38) with a boron implant occurs next, after which an oxide sidewall is formed on the gate electrode (38). The gate electrode (38) is implanted with phosphorus to form source and drain region. Thereafter annealing the structure takes place.

10 Claims, 3 Drawing Sheets

METHOD FOR FORMING A MESA-ISOLATED SOI TRANSISTOR HAVING A SPLIT-PROCESS POLYSILICON GATE

TECHNICAL FIELD OF THE INVENTION

The present invention relates to semiconductor devices and, more particularly, to a method for forming a mesa-isolated silicon-on-insulator (SOI) transistor having a split-process polysilicon gate with improved gate oxide and integrity of the mesa edges, suppressed parasitic sidewall turn-on characteristics of conventional transistors, and reduced polysilicon gate stringer formation.

BACKGROUND OF THE INVENTION

Silicon-on-insulator (SOI) technology, an important integrated circuit technology, deals with forming transistors in a layer of semiconductor material that overlies an insulating layer. A common embodiment of SOI structures is a single crystal layer or more of silicon that overlies a layer of silicon dioxide. High performance and high density integrated circuits are achievable using SOI technology, because of the reduced parasitic elements that are present in the integrated circuits that use SOI transistors.

Problems that exist with SOI transistor technology relates to polysilicon gate integrity. These problems exist in three areas. First of all, mesa-isolated SOI transistors have poor gate oxide integrity at the mesa edges due to thinning of the thermally grown gate oxide at the mesa edges. Secondly, mesa-isolated SOI transistors contain a parasitic MOSFET along the mesa sidewall whose conduction produces a high leakage currents in the SOI transistor. Another problem of known SOI transistors is that, due to the vertical topography of the SOI mesa, it is difficult to suppress the formation of polysilicon stringers along the bottom edge of the mesa during the polysilicon gate electrode anisotropic etching.

SUMMARY OF THE INVENTION

There is a need, therefore, for a method of forming a mesa-isolated silicon-on-insulator (SOI) transistor with improved gate oxide integrity at the mesa edges and the resulting mesa-isolated SOI transistor from such method.

There is a need for a method for forming a self-aligned sidewall channel stop implant that does not experience large thermal cycles and that suppresses parasitic sidewall turn-on characteristics in the mesa-isolated SOI transistor.

There is a further need for a method for forming a mesa-isolated SOI transistor that avoids polysilicon stringers that may form along the bottom edge of the mesa during anisotropic plasma etching of the polysilicon gate electrode.

The present invention, therefore, provides a method and system for forming a mesa-isolated SOI transistor using a split-process polysilicon gate that overcomes limitations associated with known methods for forming mesa-isolated SOI transistors and with transistors resulting from such methods. The term "split-process" as used herein means that the polysilicon gate is formed in two or more stages. The method of the present invention can be used with a split-process polysilicon gate electrode formation process in combination with a low pressure chemical vapor deposition, LPCVD, oxide sidewall spacer forming process to form a mesa-isolated SOI transistor that has improved gate oxide integrity at the mesa edges, a self-aligned sidewall channel-stopped implant with minimal dopant diffusion or migration to suppress parasitic sidewall turn-on, and sloped sidewall insulators that reduce the formation of polysilicon-gate stringers.

According to one aspect of the invention, there is provided a method for forming a mesa-isolated SOI transistor that has a split-process, polysilicon gate and that includes the steps of depositing a layer of buried oxide on the silicon substrate and an SOI layer on the layer of buried oxide. Instead of forming a fabrication process device having the substrate, buried oxide, and SOI layer, a prefabricated device may be used for these steps. The next step is to form a gate oxide layer on the SOI layer. A gate polysilicon and silicon nitride ($Si_3N_4$) layer are then deposited on the gate oxide layer. The polysilicon/$Si_3N_4$ layers are then formed into a mesa on the gate oxide layer. An oxide sidewall is then formed on the gate polysilicon/$Si_3N_4$ mesa. The gate polysilicon/$Si_3N_4$ mesa is then used as a mask to etch the gate oxide and SOI layers to form a mesa that includes the SOI layer, the gate oxide, the gate polysilicon and the $Si_3N_4$ layer. The resulting mesa will later form the active device area mesa. The oxide sidewall spacer is then removed from the gate polysilicon/$Si_3N_4$ mesa. The method next includes the steps of implanting the fabrication process device with a boron implant and forming an oxide sidewall on the mesa stack. Next the $Si_3N_4$ layer is removed and additional gate polysilicon is deposited, doped, patterned and etched to form the gate electrode. A device then receives a source/drain implant. Finally, the process includes the steps annealing the fabrication process device to yield the desired mesa-isolated SOI transistor.

Technical advantages of the present invention include, first of all, improved gate oxide integrity at the mesa edges. Using the present invention, the gate oxide is protected by forming an LPCVD oxide sidewall over the mesa edges. The LPCVD oxide sidewall covers the sharp mesa contour and improved the integrity of the gate oxide layer at the mesa edges, Another advantage of the present invention is that it provides a self-aligned sidewall channel-stop implant with a thermal budget that suppresses parasitic sidewall turn-on characteristics and forms a sloped sidewall insulator that reduces polysilicon gate stringer formation. The channel stop implant of the transistor is self-aligned and forms after forming the gate oxide and the initial polysilicon gate electrode. This greatly reduces the amount of thermal diffusion that the implanted sidewall experiences and, thereby, maintains the effectiveness of the sidewall dopant as well as minimizes the formation of polysilicon gate stringers.

Another technical advantage of the present invention is that it is very practical to implement. For example, the present invention requires no increase in process steps to form the mesa-isolated SOI transistor. In addition, no unusual processes are necessary to perform the present invention. That is, existing processes may effectively form the mesa-isolated SOI transistor of the present invention.

BRIEF DESCRIPTION OF THE DRAWINGS

The invention and its modes of use and advantages are best understood by reference to the following description of illustrative embodiments when read in conjunction with the accompanying drawings, wherein.

DETAILED DESCRIPTION OF THE INVENTION

The illustrative embodiments of the present invention are best understood by referring to the FIGUREs wherein like numerals are used for like and corresponding parts of the various components.

In forming a polysilicon gate that covers an isolation mesa for an SOI transistor, it is important to form a gate electrode. Processes of this type often involve an anisotropic etch that declares very sharp walls on the polysilicon of the gate. Such processes leave polysilicon residues or stringers in the corners of the electrode. These stringers act as shorting paths for current on the sidewall of the polysilicon. These paths short out the gates and can defeat the functioning of the transistor. The present embodiment, to the contrary, avoids the problems of the vertical sharp wall that anisotropic etch processing typically causes. Instead, the present embodiment provides oxide sidewalls that yield a more gradual slope on the mesa that prevents stringer formation.

The present embodiment also solves a reliability problem that exists with known isolation mesas for transistors. Because of the mesa sharp edges that result form anisotropic etching, integrity problems may arise at the gate oxide corners. These integrity problems can result in low breakdown voltages at the corners. These low breakdown voltages occur because the gate oxide that isolates the mesa from the polysilicon gate is very thin. This thinning at the corners can undermine the operation of the SOI transistor.

Another problem with existing processes for making mesa-isolated SOI transistors has to do with the fact that in forming the designed transistor, an unintentional sidewall transistor may arise that includes a source, a drain, and a gate. The unintentional sidewall transistor results from the SOI process structure. This MOSFET transistor is in parallel with the designed MOSFET at the top of mesa and, therefore, can degrade the designed MOSFET's operation. The present embodiment overcomes this problem by providing thick oxide sidewalls and boron sidewall doping that suppress the parasitic MOSFET's transistor action. The following FIGUREs and associated description illustrate the formation of the present embodiment to show how it achieves each of these objectives.

Figure 1:
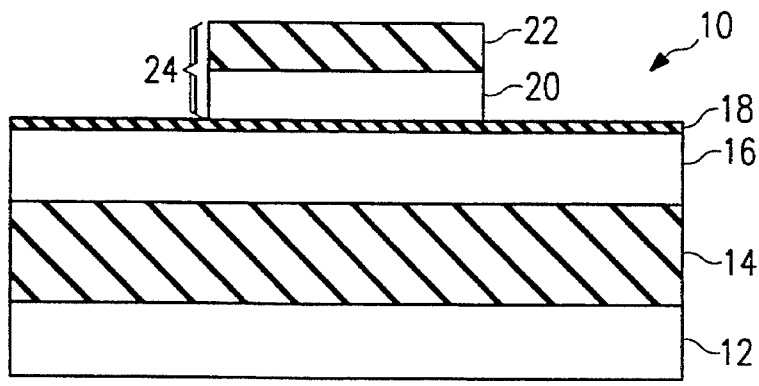
FIG. 1 shows a starting wafer for forming the present embodiment together with the polysilicon gate and silicon nitride mesa structure that forms on the gate oxide layer.

FIG. 1 shows fabrication process device 10 in its initial stage which includes silicon substrate 12 which buried-oxide layer 14 covers. SOI layer 16 covers buried-oxide layer 14, and gate oxide layer 18 covers SOI layer 16. By patterning and etching polysilicon layer 20 and $Si_3N_4$ layer 22, initial mesa 24 results.

There are numerous known methods for forming the various layers of fabrication process device 10. One method for forming fabrication process device 10 begins by applying buried-oxide layer 14 on silicon substrate 12 to a thickness of $0.4\mu$ by oxygen ion implantation. SOI layer 16 is then deposited by epitaxy to a thickness of $0.33\mu$, after which a screen oxide layer (not shown) is deposited to a thickness of $0.035\mu$. A threshold adjust implant is then used. After the implant, the process involves removing the screen oxide to permit growing gate oxide layer 18 to a thickness of $0.02\mu$. On gate oxide layer 18, polysilicon layer 20 is grown to a thickness of $0.2\mu$ using, for example, a low pressure chemical vapor deposition (LPCVD) process followed by depositing $Si_3N_4$ layer 22 to a thickness of $0.2\mu$, also, using an LPCVD process.

The next step of the process is to define the mesa pattern for initial mesa 24 that polysilicon layer 20 and $Si_3N_4$ layer 22 will form. After defining the pattern for initial mesa 24, the next step is to etch the silicon nitride using a plasma anisotropic etch. Then, etching polysilicon layer 20 takes place using, for example, a plasma anisotropic etch. This completes the stage of fabrication process device 10 that FIG. 1 depicts.

Figure 2:
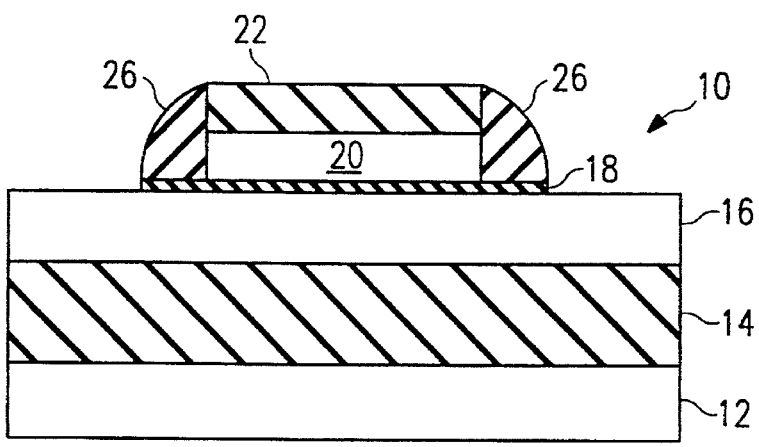
FIG. 2 shows the structure of the present embodiment following formation of an oxide sidewall spacer.

In the present embodiment, fabrication process device 10 of FIG. 1 may have as its foundation a wafer that is prefabricated to include silicon substrate 12, buried oxide layer 14, and SOI layer 16. For example, Ibis Corporation of 32A Cherry Hill Drive, Danvers, Mass., as well as numerous other companies may provide such a base structure. The next step in the process of the present embodiment, therefore, includes forming oxide sidewall 26 on initial mesa 24. This forms the more developed fabrication process device 10 that FIG. 2 illustrates. This process proceeds by depositing an oxide layer to a thickness of $0.2\mu$ using, for example, an LPCVD process. Then, the oxide layer and underlying gate oxide layer is etched with a plasma anisotropic etch to form oxide sidewalls 26.

After forming oxide sidewall 26, the process conducts an anisotropic plasma silicon etch on SOI layer 16 and forms SOI mesa 28. Oxide sidewall 26 increases the effective sides of mesa 24 and acts as a mask that produces a larger mesa of SOI layer, i.e., SOI mesa 28. After forming SOI mesa 28, the next step is to remove oxide sidewalls 26. Oxide sidewall 26 etches away very easily in the present embodiment, because it has not been annealed by any high temperature thermal cycles. In the present embodiment, therefore, etch rates of several thousand angstroms per second are practical.

Figure 3:
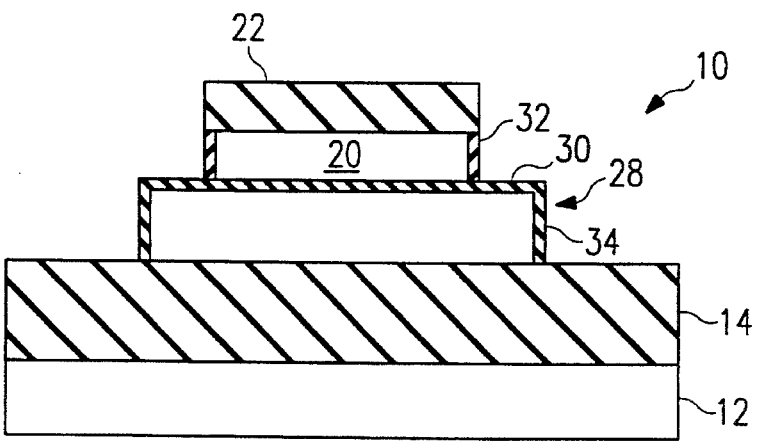
FIG. 3 illustrates the formation of the SOI mesa according to the present embodiment after removal of the oxide sidewall spacer.

FIG. 3 further shows processing of fabrication process device 10 to yield the more isolated SOI transistor of the present embodiment. This is accomplished by growing additional oxide on the exposed silicon regions. As can be seen, oxidizing the exposed silicon SOI layers 16 and 20 yields SOI mesa 28 that has additional oxide layers 30 and 34. Polysilicon layer 20 has additional oxide sidewalls 32 beneath $Si_3N_4$ layer 22. This process begins after patterning and etching SOI layer 16 to form SOI mesa 28 using a plasma anisotropic etch. The next step is to etch oxide sidewalls 26 to expose polysilicon mesa 20 using, for example, a hydrofluoric acid etch. The next step is to grow the sidewall oxide layers 34, 32 and 30 on polysilicon mesa 20 and SOI mesa 28 to a thickness of approximately $0.02\mu$. This produces the fabrication process device 10 of FIG. 3. Implanting this structure with boron to dope the exposed SOI mesa edges may take place as FIG. 4 illustrates by arrows 36 to further form fabrication process device 10.

Initial mesa 24 masks SOI mesa 28 to keep the ion implant that occurs in the steps described below in association with FIG. 4 from perturbing the threshold voltage, i.e., $V_T$ implant that was done in association with FIG. 1. Thus, ion implant 36 of FIG. 4 only dopes the sidewalls of SOI mesa 28. Since the boron concentration is higher for SOI mesa 28 sidewalls, the parasitic MOSFET that occurs in this process has a higher $V_T$ than does the top transistor. This feature is important in assuring that the resulting mesa-isolated SOI transistor does not have the detrimental parasitic transistor of known devices. This dopant may be implanted using two different energy levels, for example. One energy level (e.g., 80 KeV ions) results in peak dopant concentration is along the bottom of SOI mesa 28. Another energy level (e.g., 20 KeV ions) assures that the peak dopant concentration is along the top and sidewalls of mesa 28. The result of using selected degrees of these two different energy level ions is that uniform doping occurs along the sidewalls of SOI mesa 28.

Figure 4:
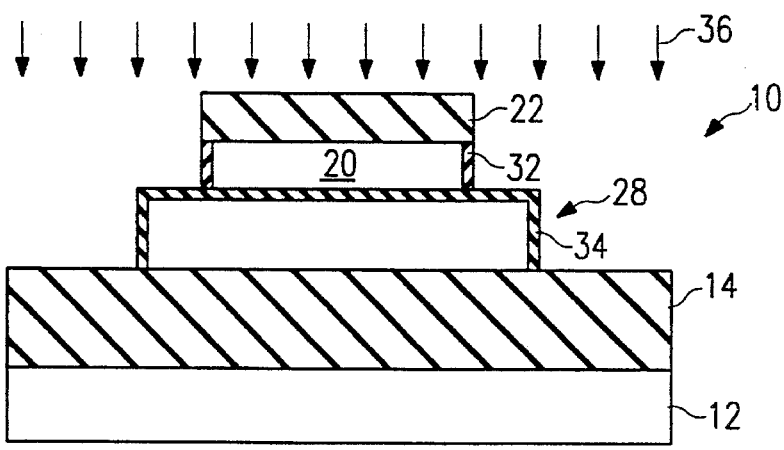
FIG. 4 illustrates boron implantation to suppress parasitic sidewall turn-on of the structure of the present embodiment.

Implant 36 of FIG. 4 establishes the sidewall threshold voltage, $V_T$, at which the parasitic sidewall transistor turns on. An important aspect of the present embodiment is that gate oxidation occurs much earlier in the process than is typical for processes that form a mesa-isolated SOI transistor. By growing the gate oxide first then performing the sidewall $V_T$ implant the process of the present embodiment minimizes the number of thermal cycles through which fabrication process device 10 must go following the sidewall $V_T$ implant. By minimizing the number of thermal cycles through which fabrication process device 10 goes following the sidewall $V_T$ implant, the implant dopants migrate or redistribute less than during conventional processes steps of forming a mesa-isolated SOI transistor.

Figure 5:
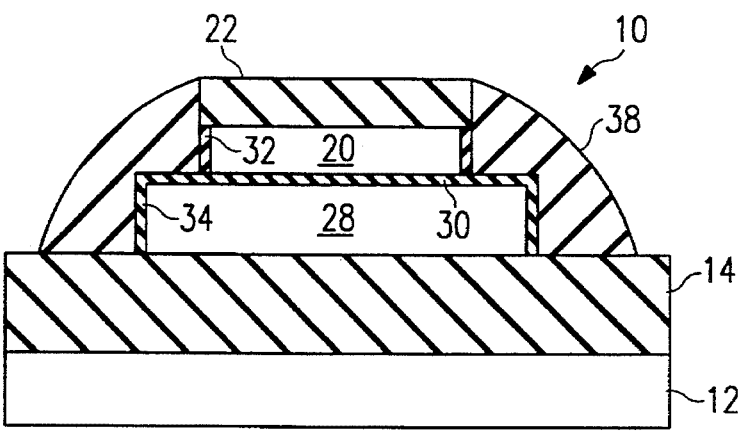
FIG. 5 illustrates formation of a densified oxide sidewall on the mesa of the present embodiment.

FIG. 5 shows further development of fabrication process device 10 including the formation of oxide sidewalls 38. The stage of the present process that FIG. 5 describes overcomes the gate oxide thinning problem that often occurs at the corners of the SOI mesa structure. Oxide sidewall 38 processing begins first by performing an oxide deposition to a thickness of approximately 0.45μ using, for example, an LPCVD process. This is followed by an anisotropic etch which forms deposition oxide sidewall 38. Then, oxide sidewall 38 is densified in an ambient steamed environment of 800° C. to raise the etch rate of the oxide up to thermally grown oxide. This makes oxide layer 38 dense and increases the oxide at the corner of SOI mesa.

Figure 6:
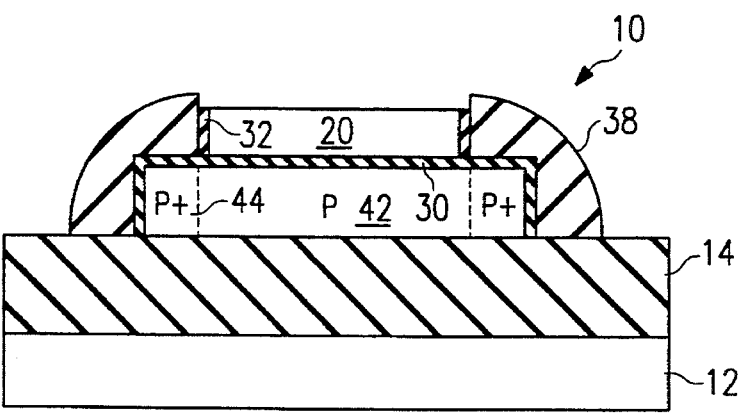
FIG. 6 illustrates the structure resulting from etching the silicon nitride layer of the present embodiment.

An important aspect of the construction of FIG. 1 is that the present embodiment uses a split-process polysilicon deposition which does not deposit all of the polysilicon, layer 20, for the mesa-isolated SOI transistor at one time. For example, in the present embodiment, only approximately one-half of the desired thickness is deposited in each step of a two-step deposition process. FIG. 6, therefore, shows the next stage of fabrication process device 10 which includes removing $Si_3N_4$ layer 22 to expose polysilicon layer 20 and sidewalls 32 for completing the polysilicon gate forming process of the present embodiment. In this process, oxide sidewall 36 is removed to some degree but not to the degree to expose sidewalls 32 at their sides. The present embodiment uses a short Hf dip and a hot phosphoric acid etch to remove $Si_3N_4$ layer 22.

Removing silicon nitride layer 22 exposes polysilicon layer 20. This permits deposition of the remaining polysilicon to increase the gate electrode thickness and thereby complete the second phase of the present split-process polysilicon deposition. This makes polysilicon layer 20 act as a normal gate to connect to other transistors. This process may attack some of oxide sidewall 38. Note, however, that this process typically attacks not more than 500 Å of oxide layer 38.

Figure 7A:
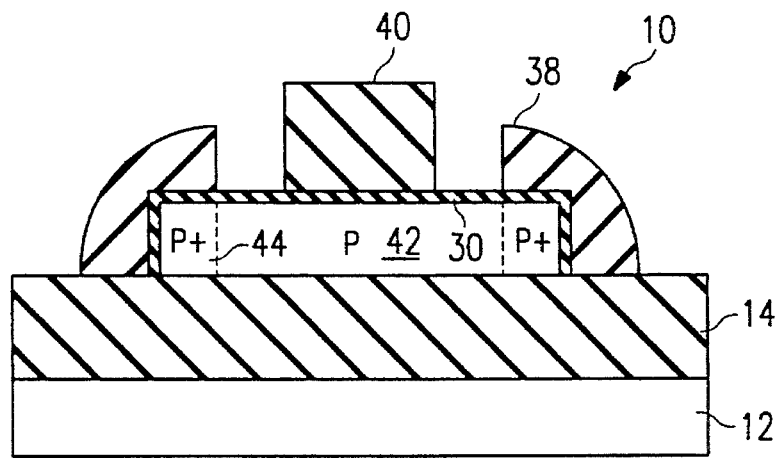
FIGS. 7a and 7b illustrate the deposition of additional polysilicon and formation of the polysilicon gate electrode of the present embodiment.
Figure 7B:
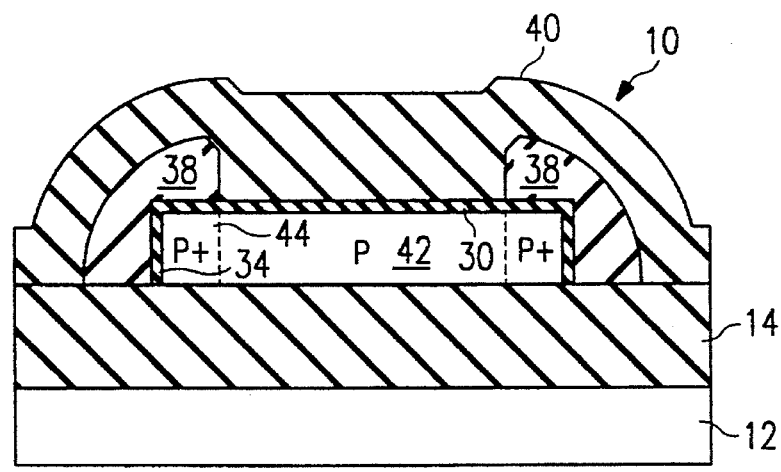

FIGS. 7a and 7b show, respectively, a front view and a side view of the results of the next stage of the present process. With a view to both FIGS. 7a and 7b, the result of this stage of the process is gate electrode 40 that in the FIG. 7b side view covers oxide sidewall 38 and oxide layer 30. In this FIGURE, the P+ boron doped sidewall of mesa 28 and the P-type doping in mesa 28 is also shown.

The stage that produces the structure of FIGS. 7a and 7b, therefore, includes the step of depositing additional polysilicon over polysilicon layer 20 to a thickness of 0.25μ, using an LPCVD process, for example, for a combined thickness of approximately 0.45μ. The next step is to dope the entire polysilicon gate with $POCl_3$ to reach a resistivity of 60 Ω/□. Next, the polysilicon pattern is made to form gate electrode 40. The next step is to etch the polysilicon to form gate electrode 40. A plasma anisotropic etch satisfactorily produces the desired gate electrode.

Sidewall 38 serves two functions. One function is to increase the thickness of oxide at the corner of SOI mesa 28. The second function is to provide a gradual slope over which polysilicon gate electrode 40 forms in covering oxide sidewall spacer 38. This avoids the formation of stringers that can defeat proper operation of the mesa-isolated SOI transistor.

Figure 8:
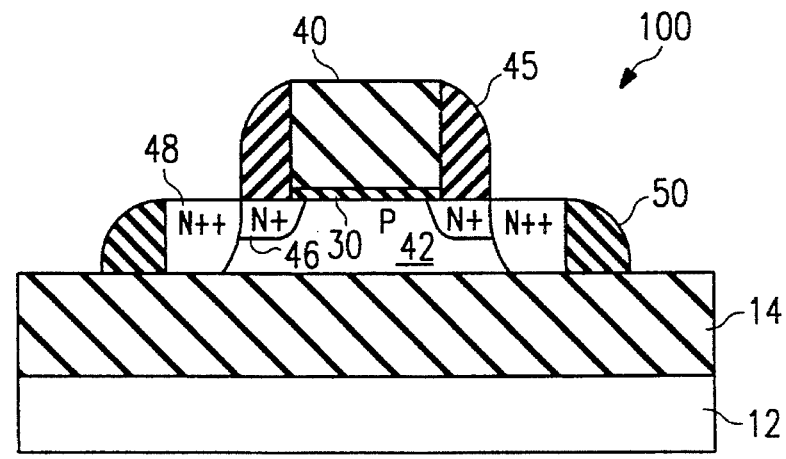
FIG. 8 illustrates formation of the complete structure of the present embodiment following anneal implants.

Having formed fabrication process device 10 in its FIGS. 7a and 7b stage, the next step of the process results in transistor 100 that FIG. 8 shows. Thus, in FIG. 8, there appears mesa-isolated SOI transistor 100 of the present embodiment that is formed from fabrication process device 10 of FIGS. 7a and 7b. Mesa-isolated SOI transistor 100 includes polysilicon gate 40 having oxide sidewall 45 that contact SOI layer 28. Gate structure 40 is separated from SOI mesa 28 by gate oxide layer 30. SOI mesa 28 includes P-type region 42 that adjoins $N^+$ source/drain region 46. $N^+$ source/drain region 46 is beneath oxide sidewalls 45. $N^+$ regions 46 and P region 42 adjoin a heavier doped. $N^{++}$ region 48. $N^{++}$ source/drain region 48 adjoins sidewall 50. As already stated, the entire structure attaches to buried oxide layer 14 that covers silicon substrate 12.

In forming mesa-isolated SOI transistor 100, final steps include performing a lightly-doped drain (LDD) implant to produce region 46, an LDD spacer. The LDD implant is a phosphorus implant. Next, the process involves depositing an oxide sidewall spacer to a thickness of 0.2μ using an LPCVD process to form the LDD spacer oxide, region 45. The oxide sidewall spacer is then etched using, for example, a plasma anisotropic etch process to form the LDD spacer oxide, region 45. Then, the process involves depositing a screen oxide to a thickness of approximately 0.03μ using, for example, an LPCVD process. Following this is a phosphorus or arsenic source/drain implant to form $N^{++}$ region 48. Finally, the structure of mesa-isolated SOI transistor 100 is completed by annealing the implants at a temperature of approximately 850° C. or higher.

The method of the present embodiment overcomes the poor gate oxide integrity problem of known mesa-isolated SOI transistors by increasing the thickness of the oxide at the mesa corners. The present embodiment overcomes the parasitic MOSFET problem by implanting the dopant along the SOI mesa 28 edges. This raises the $V_T$ of the parasitic relative to the $V_T$ of the main MOSFET. By introducing the dopant into the MOSFET bulk after completing the transistor-forming high-temperature cycles, the present embodiment minimizes dopant migration or redistribution. This maintains the surface concentration of the dopant and maintains a high $V_T$ at the parasitic MOSFET. The parasitic MOSFET, therefore, does not adversely affect operation of SOI transistor 100.

In summary, the present embodiment provides a method for forming a mesa-isolated SOI transistor using a split-process polysilicon gate that includes the steps of first forming a layer of buried oxide under a silicon layer on a silicon substrate. Then, the method includes the step of increasing the thickness of the SOI layer on the layer of buried oxide if needed, followed by forming a gate oxide layer on the SOI layer. The next step is to form a gate polysilicon and $Si_3N_4$ mesa stack on the gate oxide layer. The next step is to form an oxide sidewall on the gate polysilicon/$Si_3N_4$ mesa to increase its size. Then, the method includes the step of forming an SOI mesa under the gate polysilicon/$Si_3N_4$ mesa stack using the $Si_3N_4$ mesa and the polysilicon mesa as an etch mask. The next step is to remove the oxide sidewall on the gate polysilicon mesa and the $Si_3N_4$ mesa. Then, the method includes the step of implanting the structure with the boron implant, as well as forming an oxide sidewall on the SOI mesa gate mesa and $Si_3N_4$ mesa. The next step is to remove the $Si_3N_4$ mesa. Then follows the step of forming a gate electrode by depositing additional polysilicon, doping the polysilicon with phosphorous, then patterning and etching the gate electrode. The process forms a lightly doped drain region by implanting phosphorous followed by a sidewall spacer oxide. A heavier doped source/drain region is then formed using arsenic and/or phosphorus. Thereafter, the structure is annealed to form the mesa-isolated SOI transistor of the present embodiment.

There are any number of alternatives or changes in the design at which that may be readily apparent to one of ordinary skill in the art. Such alternatives may not be employed in the mesa-isolated SOI transistor of the present embodiment for any number of reasons, such as costs and performance considerations, packaging constraints, availability of materials, arbitrary design decisions, and the like. A number of these alternatives have been mentioned above. This is, of course, done without limitation of other embodiments which may be equally obvious to one of ordinary skill in the art, but which are not mentioned here because of time and space constraints. Thus, the invention is intended to be limited only by the claims which are meant to cover such obvious alternatives and deviations from the preferred design and embodiment.

What is claimed is:

1. A method for forming a mesa-isolated SOI transistor having improved gate oxide integrity, comprising the steps of:

forming an SOI etch mask on an SOI layer, the SOI etch mask comprising a gate oxide layer covered by a polysilicon layer, the polysilicon layer covered by a $Si_3N_4$ layer, the SOI etch mask further comprising a first $SiO_2$ sidewall spacer on sidewalls of said polysilicon layer;

forming an SOI mesa from the SOI layer by etching using the SOI etch mask;

removing the first $SiO_2$ sidewall spacer from the SOI etch mask;

doping the exposed edges of the SOI mesa to establish a threshold voltage adjust implant in the SOI mesa;

removing the $Si_3N_4$ layer;

depositing additional polysilicon on the polysilicon layer and SOI mesa to form a gate electrode layer;

doping the gate electrode layer;

etching the gate electrode layer to form a gate electrode;

forming a drain region in the SOI mesa by introducing a dopant;

forming a second $SiO_2$ sidewall spacer on sidewalls of the gate electrode;

forming a source/drain region in the SOI mesa by introducing additional dopants using the second $SiO_2$ sidewall spacer as a mask to yield a mesa-isolated SOI transistor comprising the gate electrode and the source/drain region; and annealing the mesa-isolated SOI transistor.

2. The method of claim 1, further comprising the step of minimizing thermal diffusion and dopants in the mesa-isolated SOI transistor by performing the threshold voltage adjust implants and forming the gate oxide layer, the silicon layer, and the $Si_3N_4$ layer before forming the SOI mesa.

3. The method of claim 1, further comprising the step of using the $Si_3N_4$ layer for protecting the polysilicon layer during the formation of the SOI mesa.

4. The method of claim 1, further comprising the steps of:
   covering the exposed edges of the SOI mesa with a conformal oxide for improving the integrity of the gate oxide layer.

5. The method of claim 1, further comprising the steps of first forming a portion of the gate electrode layer from the polysilicon layer that defines the position of the gate electrode layer relative to the gate oxide layer and SOI mesa; and
   forming the remaining portion of the gate electrode layer from the additional polysilicon layer after performing thermally sensitive steps that diffuse dopants in the gate electrode.

6. A method for forming a mesa-isolated SOI transistor having a split-process polysilicon gate, comprising the steps:

forming a layer of buried oxide on a silicon substrate;

forming an SOI layer on the layer of buried oxide;

forming a gate oxide layer on the SOI layer;

forming a gate polysilicon layer on the gate oxide layer;

forming a $Si_3N_4$ layer on the polysilicon layer and forming a polysilicon/$Si_3N_4$ mesa by etching the gate oxide layer, the gate polysilicon layer, and the $Si_3N_4$ layer;

forming a first oxide sidewall on the gate polysilicon/$Si_3N_4$ mesa structure to form an etch mask;

forming an SOI mesa under the etch mask, the SOI mesa having a larger diameter than the polysilicon/$Si_3N_4$ mesa;

removing the first oxide sidewall from the gate polysilicon/$Si_3N_4$ mesa;

implanting the polysilicon/$Si_3N_4$ mesa and SOI mesa with a boron implant;

forming a second oxide sidewall on the polysilicon/$Si_3N_4$ mesa and SOI mesa;

removing the $Si_3N_4$ portion of the polysilicon/$Si_3N_4$ mesa to form a polysilicon mesa;

depositing an additional polysilicon layer on the polysilicon mesa to form a polysilicon gate electrode layer;

doping the polysilicon gate electrode layer with a N-type dopant;

etching the polysilicon gate electrode layer to form a gate electrode;

doping the gate electrode to form an N-type lightly-doped source/drain region;

implanting source/drain region to form a heavily doped source/drain region; and annealing the remaining structure.

7. The method of claim 6, further comprising the step of minimizing thermal diffusion of dopants in the polysilicon gate electrode by performing the threshold voltage adjust implant prior to depositing the additional polysilicon layer on the polysilicon mesa in forming the polysilicon gate electrode layer.

8. The method of claim 6, further comprising the step of using the $Si_3N_4$ layer to protect the polysilicon layer during said SOI mesa forming step.

9. The method of claim 9, further comprising the steps of:

enlarging the gate polysilicon/$Si_3N_4$ mesa structure using the first oxide sidewall so that the etch mask forms the SOI mesa with a larger diameter than the polysilicon/$Si_3N_4$ mesa; and covering the exposed edges of the SOI mesa with a conformal oxide for improving the integrity of the gate oxide layer.

10. The method of claim 6, wherein said gate electrode forming step further comprises the steps of:

first forming the polysilicon layer on the SOI layer for defining the position of the gate electrode relative to the gate oxide layer and SOI mesa; and completing deposition of the polysilicon gate electrode layer after performing said SOI mesa forming step.

\* \* \* \* \*